United States Patent
Zawaideh

[11] Patent Number: 5,877,557
[45] Date of Patent: Mar. 2, 1999

[54] LOW TEMPERATURE ALUMINUM NITRIDE

[75] Inventor: Emad S. Zawaideh, Encinitas, Calif.

[73] Assignee: Raytheon Company, Lexington, Mass.

[21] Appl. No.: 627,717

[22] Filed: Apr. 1, 1996

[51] Int. Cl.$^6$ .................................................. H01L 21/441
[52] U.S. Cl. ......................... 257/748; 257/750; 257/765; 438/688; 438/661
[58] Field of Search ................................. 437/194, 190, 437/192; 257/765, 748, 741, 750, 751, 753, 771; 438/660, 661, 658, 688

[56] References Cited

U.S. PATENT DOCUMENTS

| | | |
|---|---|---|
| 5,244,535 | 9/1993 | Ohtsuka et al. . |
| 5,270,263 | 12/1993 | Kim et al. ................................ 437/228 |
| 5,286,676 | 2/1994 | Kruger et al. ........................... 437/190 |
| 5,432,128 | 7/1995 | Tsu . |
| 5,525,542 | 6/1996 | Manion et al. ......................... 437/186 |

FOREIGN PATENT DOCUMENTS 59-84553  5/1984  Japan .

*Primary Examiner*—Caridad Everhart
*Attorney, Agent, or Firm*—Leonard A. Alkov; William C. Schubert; Glenn H. Lenzen, Jr.

[57] ABSTRACT

A process for metallizing semiconductor devices is provided, wherein a plurality of aluminum contacts is formed. The plurality of aluminum contacts is at least partially nitrided in a nitrogen-containing plasma at a temperature of less than about 350° C. The aluminum nitride layer or cap is capable of eliminating aluminum corrosion without affecting the electrical properties of the aluminum contacts.

5 Claims, 2 Drawing Sheets

LOW TEMPERATURE ALUMINUM NITRIDE

BACKGROUND OF THE INVENTION

1. Field of the Invention

The present invention is directed to metallization employed in silicon semiconductor devices, and, more particularly, is directed to a nitridation process used to form aluminum nitride on a previously-deposited aluminum layer.

2. Description of Related Art

Aluminum is often used as a conductive metal layer in semiconductor devices. However, it is desirable to protect the aluminum against chemical attack by water vapor, which can form corrosion products that adversely affect the electrical properties of aluminum metal.

Accordingly, there is a need for a means of providing protection of aluminum against chemical attack by water vapor.

SUMMARY OF THE INVENTION

In accordance with the present invention, a low temperature ($\leq 350°$ C.) aluminum nitride process is provided, in which aluminum nitride (AlN) is formed as a protective layer against aluminum corrosion, to prevent the chemical reaction between aluminum and water. The AlN thickness is only 10 to 20 Å, which does not affect the electrical properties of aluminum.

The process of the invention comprises forming and patterning an aluminum contact, interconnect layer, or pad, and forming the aluminum nitride layer by a plasma nitridation process. The nitridation is performed using a reducing gaseous nitrogen source, such as nitrogen ($N_2$) or ammonia ($NH_3$).

The aluminum nitride layer, or cap, that is formed in accordance with the present invention is capable of preventing aluminum corrosion without affecting the electrical properties of the aluminum contact or interconnect or pad.

DESCRIPTION OF THE PREFERRED EMBODIMENTS

Figure 1:
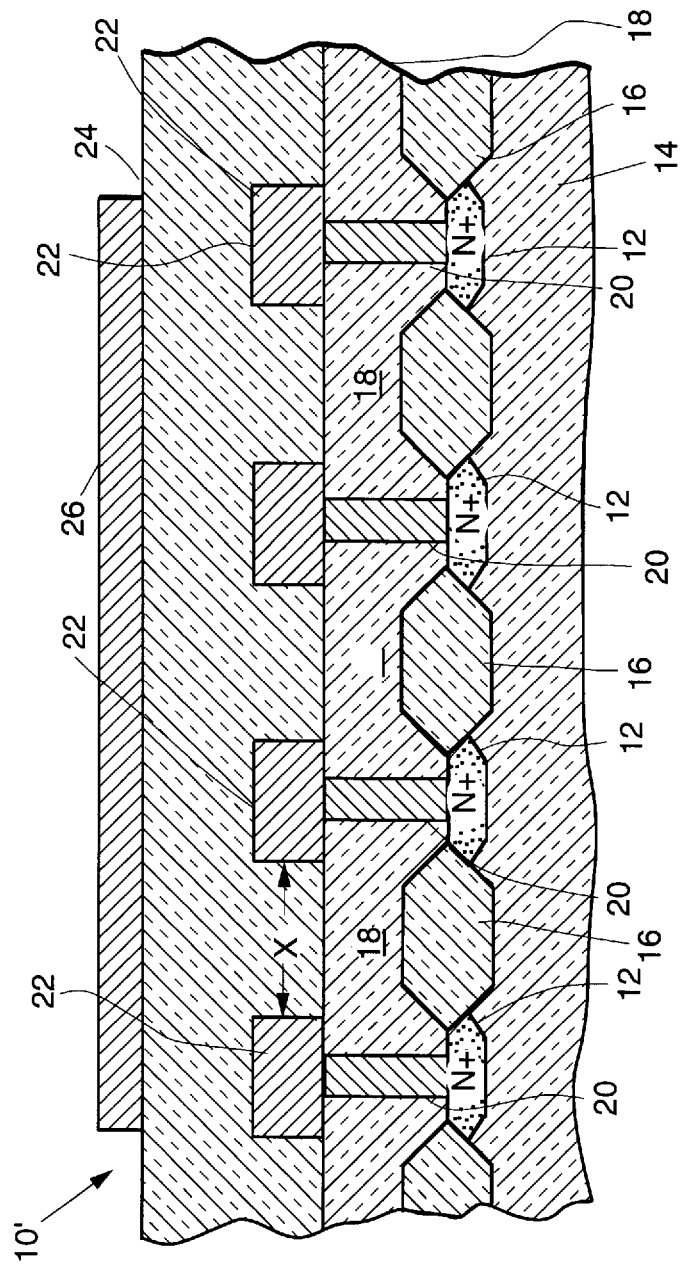
FIG. 1 is a side elevational view of a portion of a prior art semiconductor device, having an aluminum layer thereon for electrical contact.

FIG. 1 shows a portion of a prior art semiconductor device 10, with a plurality of doped regions 12 shown here N$^+$, formed in a semiconductor substrate 14, such as silicon. A field oxide 16 separates the doped regions 12 from each other. A first planarized interlevel dielectric layer 18 surrounds metal contact plugs 20, such as aluminum, which contact the doped regions 12. First metal interconnects 22 electrically contact the metal plugs 20 in a predetermined pattern. The metal interconnects, which may comprise aluminum or another metal, are spaced apart by a distance X. In this technology, the value of X is about 1 $\mu$m (for 2 $\mu$m design rules). However, the present invention is not limited to this value of X, and may be employed with any design rule technology.

A second planarized interlevel dielectric layer 24 surrounds the first metal interconnects 22. On top of the second interlevel dielectric layer 24 there is formed a second metal interconnect 26.

Figure 2:
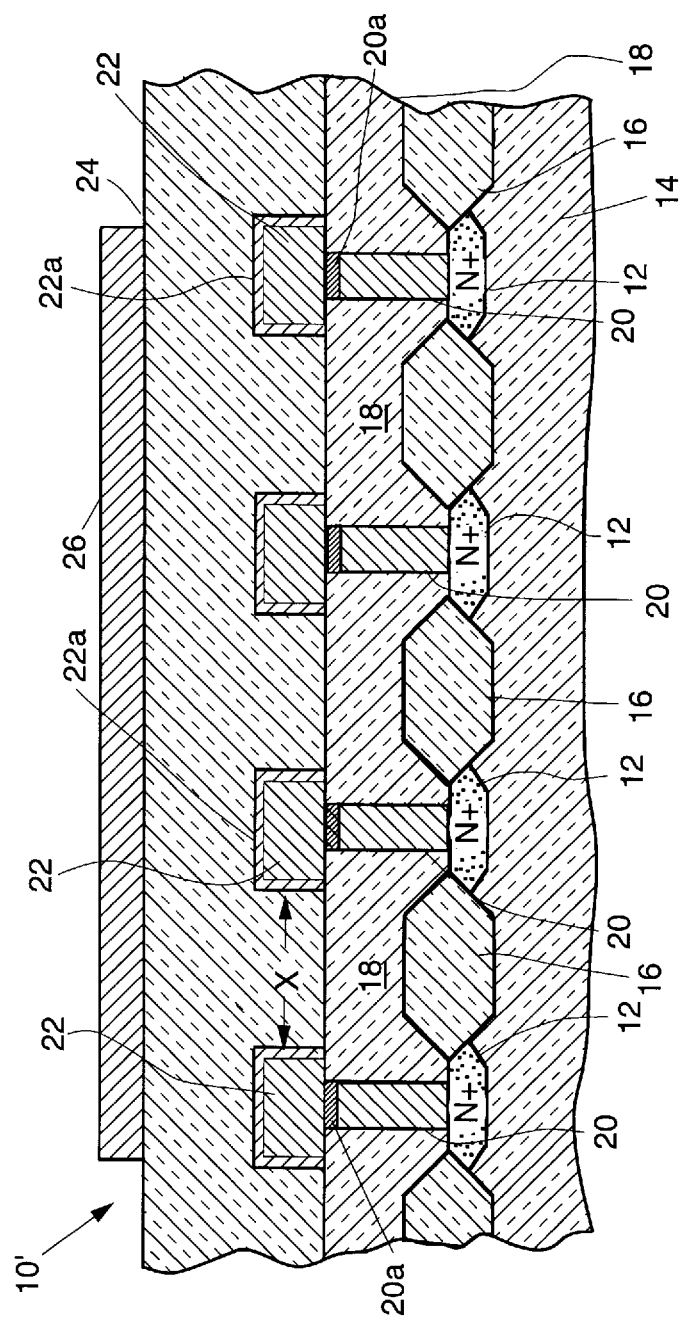
FIG. 2 is a side elevational view of a portion of a semiconductor device incorporating nitridation of aluminum (not to scale) in accordance with the present invention.

In accordance with the present invention, a thin (about 10 to 20 Å) aluminum nitride film 20a is formed on top of the aluminum plugs 20 by a nitridation process. The aluminum nitride film is formed is done subsequent to formation of the aluminum plugs 20 and prior to formation of the interconnects 22. The resulting device structure 10' is depicted in FIG. 2. To the extent that the interconnects 22 also comprise aluminum, the nitridation process of the present invention is also employed to form a protective film 22a around the exposed portions of the interconnects 22. Further, aluminum bonding pads (not shown) may also be nitrided in accordance with the process of the present invention. Wires from external circuitry are bonded to such bonding pads and provide electrical connection of the device 10' to the external circuitry.

As used herein, the term "aluminum contacts" is intended to include aluminum plugs, aluminum interconnects, aluminum bonding pads, and other such structures comprising aluminum in integrated circuits.

The nitridation process of the present invention is performed in a nitrogen-containing plasma, employing a reducing gaseous source of nitrogen, such as $NH_3$ or $N_2$, at a low temperature, namely, $\leq 350°$ C. The source of nitrogen may be used at 100% concentration or diluted with an inert gas, such as argon. A small amount of the inert gas, up to about 10 percent by volume, enhances ignition of the plasma, and is preferably employed. While up to 90 percent by volume of the inert gas could be employed, there would be less of the nitrogen-containing gas available for nitridation.

The plasma can only convert the top 10 to 20 Å of aluminum plugs 20 and aluminum interconnects 22 to aluminum nitride film 20a, 22a and is thus self-limiting. The thickness of the nitride film 20a, 22a may be verified using ellipsometric measurement.

The plasma nitridation of aluminum is substantially complete within about 30 minutes at a temperature of about 350° C. and somewhat longer at lower temperatures; for example, a lower temperature of about 200° C. would require a nitridation time of about 60 minutes. Further, the plasma nitridation may be performed at a temperature as low as room temperature. Also, while the plasma nitridation could be performed at a temperature exceeding 350° C., with concomitant increased nitridation rate, no advantage is derived over other processes and, in fact, may cause melting of other metals elsewhere on the semiconductor chip.

The plasma nitridation is preferably performed using plasma enhanced chemical vapor deposition (PECVD) under a moderate vacuum. Other parameters that may be varied include the power level of the PECVD system and the pressure.

The power level is unique to each particular PECVD apparatus. The power may be varied, for example, from 50% to 90% in the specific apparatus utilized in the process described in the Example below. The higher the power, the higher the rate of nitridation. Variation of the power in other PECVD apparati is easily within the ability of the person skilled in this art.

The pressure is selected to be sufficient to ignite the plasma, as is well-known. A pressure of about 1 Torr is advantageously employed in the practice of the present invention.

EXAMPLE

The following is an example of the process of the present in accordance with the present invention.

A layer comprising 6000 Å Al/Si was deposited by sputtering on six blank Si wafers, employing Al/Si (98% Al, 2% Si) as the sputtering target. Three wafers were placed in a plasma-enhanced chemical vapor deposition (PECVD) nitride system at 90% $NH_3$ (10% argon), 50% power, 1 Torr of pressure for 30 minutes at 350° C. An AlN film of about 20 Å thickness was formed, as determined by ellipsometry.

One control sample (without nitride) and one nitride wafer (aluminum nitride, as formed above) were placed in water at 30° C. for 30 minutes. The control sample was severely corroded, as shown by the presence of voids in the aluminum layer 20, while the aluminum nitride sample was unchanged.

One control sample with another test sample was also left in water overnight (18 hours). The control sample was severely voided, while the nitrided one was unchanged.

Also, one control sample and a nitride sample were placed in boiling water for 30 minutes. The nitrided sample was unchanged, while the control was severely attacked and corroded.

From the foregoing results, it can be seen that the thin (10 to 20 Å) aluminum nitride was capable of protecting the aluminum from corrosion under severe conditions.

The process of the present invention can be used in all integrated circuit (IC) products that use aluminum metallization, either alone or with additional metallization used for barrier metals and metal caps.

The aluminum nitride layer or cap is capable of eliminating aluminum corrosion without affecting the aluminum electrical properties.

Thus, a process for nitriding aluminum contacts is provided, employing a comparatively low temperature nitridation plasma process. It will be readily appreciated by those skilled in this art that various changes and modifications of an obvious nature may be made, and all such changes and modifications are considered to fall within the scope of the present invention, as defined by the appended claims.

What is claimed is:

1. A process for metallizing semiconductor devices in which corrosion of such metallization resulting from exposure to water vapor is prevented, said process including the steps of forming a plurality of aluminum contacts and, prior to formation of a semiconductor layer on said plurality of aluminum contacts, contacting the aluminum contacts with a nitrogen-containing plasma at a temperature within the range of about 200° to 350° C. for a period of time of about 30 to 60 minutes to thereby convert the top surface of the aluminum contacts to a layer of aluminum nitride having a thickness of about 10 to 20 Angstroms whereby corrosion of the aluminum is prevented.

2. The process of claim 1 wherein said contacting said aluminum contacts with said nitrogen-containing plasma is performed by a plasma-enhanced chemical vapor deposition at a pressure of about 1 Torr.

3. The process of claim 2 wherein said plasma is formed from a nitrogen-containing source selected from the group consisting of ammonia and nitrogen.

4. The process of claim 3 wherein said nitrogen-containing source is diluted up to about 90% with an inert gas.

5. A semiconductor device including at lease one aluminum contact, said aluminum contact protects with an aluminum nitride film with a thickness within the range of about 10 to 20 Å, wherein said aluminum nitride film covers top and side surfaces of said aluminum contact.

* * * * *